Oct. 2, 1962 R. C. FRANK 3,056,371

DIP SOLDERING APPARATUS

Filed May 1, 1958 2 Sheets-Sheet 1

INVENTOR
RUSSELL C. FRANK,
BY
[signature]
AGENT

DIP SOLDERING APPARATUS

Filed May 1, 1958 2 Sheets-Sheet 2

INVENTOR.
RUSSELL C. FRANK,
BY
Donald L. Royer
AGENT

United States Patent Office 3,056,371
Patented Oct. 2, 1962

3,056,371
DIP SOLDERING APPARATUS

Russell C. Frank, El Segundo, Calif., assignor to Hughes Aircraft Company, Culver City, Calif., a corporation of Delaware Filed May 1, 1958, Ser. No. 732,234
5 Claims. (Cl. 113—126)

This invention relates generally to a soldering apparatus and relates more particularly to an apparatus for applying molten solder in a dip-type manner to electrical or electronic component leads associated with printed circuits. Furthermore, the invention finds particular utility in connection with the soldering of electronic component leads to printed circuit boards forming portions of so-called cordwood type electronic circuit modules.

In the manufacture of electronic circuits and apparatus embodying such circuits, one type of circuit assembly technique relates to the disposition of various electronic components such as resistors, capacitors, diodes and the like, in a stacked parallel manner between a pair of parallel printed circuit boards disposed normal to the leads of the components and with such component leads extending through openings in the printed circuit boards. The components thus resemble cordwood in this stacked arrangement and for completion of a particular circuit the protruding ends of the component leads must be soldered or otherwise affixed in position relative to a printed circuit carried by the parallel boards forming portions of the module.

Heretofore it has been common practice manually to apply a small quantity of solder to each component lead at each attachment point of such lead to the printed circuit. While this technique is satisfactory for low quantity production of such circuit modules, it is very time consuming and permits introduction of possible errors on the part of the operator in producing a possibly improper solder connection or bypassing one or more places where solder connections should be made.

Accordingly, it has also become common practice to employ a soldering technique which includes the dipping of an entire surface of a printed circuit board and component leads into molten solder for a predetermined length of time, thus to affect soldering of all of the appropriate connections in a simultaneous manner. This soldering technique is also satisfactory and saves a considerable amount of time over the individual hand soldering methods. However, there are certain problems that still exist relative to the disposition of the printed circuit board in molten solder, the depth of penetration of the board into the solder, the support of the circuit boards and components, the control of dipping time and the application of solder to more than a single side of an individual board or a circuit module assembly.

It is accordingly one object of the present invention to provide an automatically operated apparatus for supporting and rotating a circuit board or module and disposing the circuit assembly relative to a quantity of molten solder.

It is another object of the invention to provide an apparatus for supporting an electronic circuit module, for first dipping one surface of the module in molten solder, automatically rotating the module for presentation of an alternate surface and thereafter dipping this alternate surface in the molten solder.

It is still another object of the invention to provide a simplified, reliable, efficient and economical apparatus for dip soldering electronic component leads to printed circuits forming a portion of electronic cordwood type circuit modules.

A still further object of the invention is to provide an apparatus for supporting and repositioning a cordwood type electronic circuit module together with means for providing a timed sequence of operations commensurate with dip soldering requirements.

Other and further important objects of the invention will become apparent from the disclosures of the following detailed specification, appended claims and accompanying drawings, wherein:

With reference to the drawings, the soldering apparatus hereof is mounted on and carried by a plate or base structure 10. The structure 10 is fixed in position relative to a container 11 that is adapted to retain a quantity of molten solder 12. The molten solder 12 is maintained at a relatively constant temperature sufficient to affect the molten condition thereof by any suitable means such as, for example, heaters or the like (not shown) which may be disposed in the lower portion of the container 11. Means (not shown) are also preferably provided for maintaining the solder 12 at a constant level within the container 11.

Figures 1, 2:
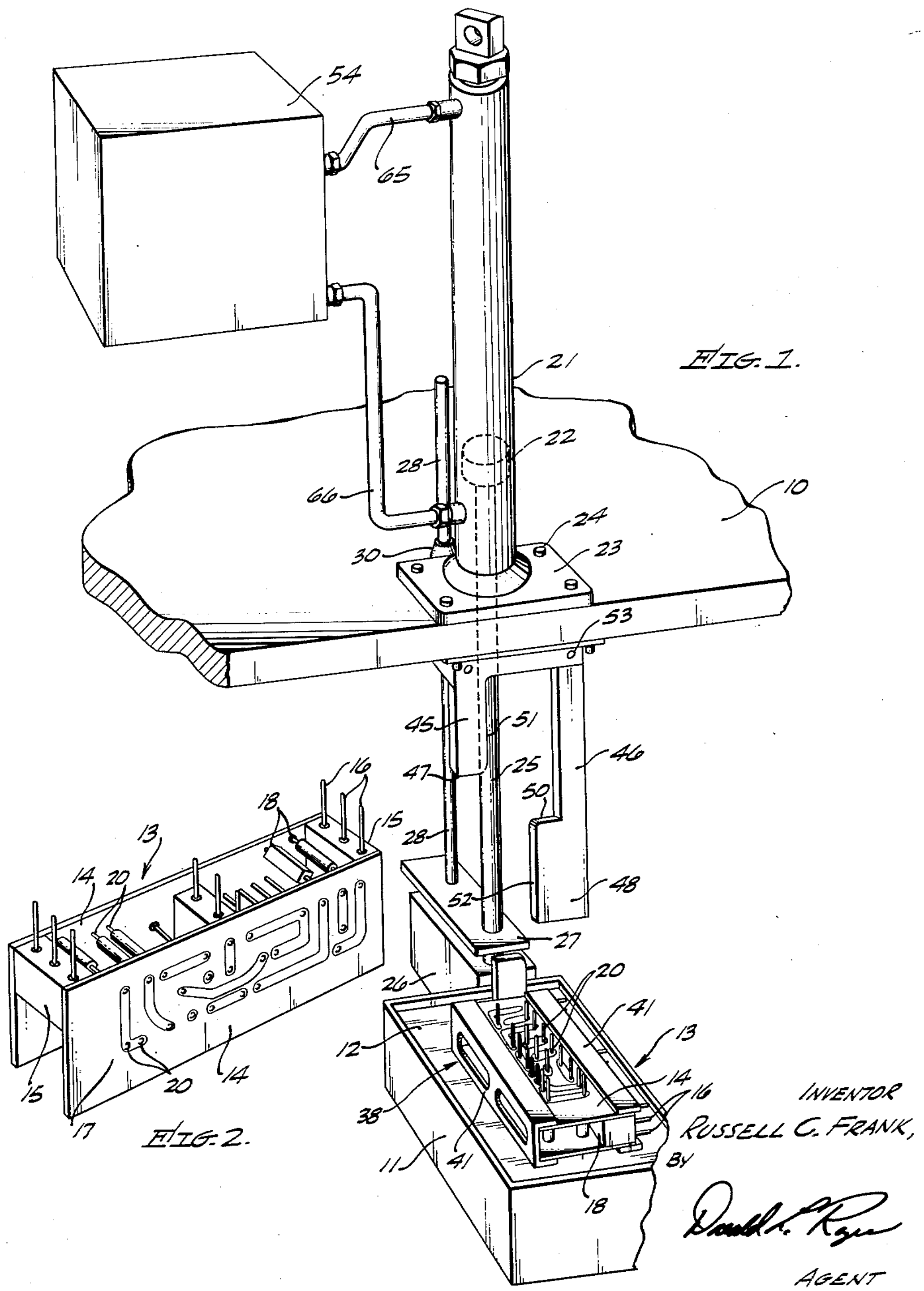
FIGURE 1 is a perspective view of the present automatic dip soldering apparatus.
FIG. 2 is a perspective view representing a typical type of electronic circuit module that may be employed with the apparatus of this invention.

With reference to FIG. 2, a typical type of electronic circuit module of the cordwood style is shown and indicated generally at 13. The module 13 includes a pair of circuit boards 14 that are disposed in parallel relationship and maintained in this relationship by means of spacers 15 which extend therebetween and from which pins 16 extend. The pins 16 may be used for attaching the module to other electronic structures. Each of the boards 14 is provided with a printed circuit 17 and a plurality of components 18 are disposed within the confines of the circuit boards 14 with leads 20 thereof extending laterally through suitable openings in the boards 14. The leads 20 are ultimately secured to the printed circuit 17 by means of soldering through use of the device of this invention, with extending ends of such leads being thereafter trimmed closely adjacent the printed circuit 17, thus to produce a module of the general type shown in FIG. 2.

With reference primarily to FIG. 1, the device hereof includes a cylinder 21 in which a piston 22 is positioned. The cylinder 21 is secured to the base 10 as by a flange 23 and suitable screws 24. The piston 22 is carried on an upper end of a piston rod 25 that is in turn connected at its lower end to a bearing block 26. The rod 25 also supports a plate 27 adjacent the block 26, there being a guide rod 28 disposed upwardly from the plate 27. The guide rod 28 slidably extends through a suitable guide 30 in the base 10 and serves to prevent rotation of the piston rod 25 and other apparatus supported thereby.

The block 26 has a bore 31 in which a pair of bearings 32 are disposed. A shaft 33 is pivotally journalled in the bearings 32 and disposed normal to the axis of the piston rod 25. One end of the shaft 33 is adapted to support an enlargement 34 having longitudinally extending flattened surfaces which cooperate with a detent 35 that is disposed in a lateral bore 36 and biased toward the enlargement 34 by means of a compression spring 37. The arrangement of the member 34 and detent 35 serves pivotally to establish pivotal positions of the shaft 33 for a purpose to be hereinafter more fully described.

Another end of the shaft 33 is connected to and adapted to support a circuit module carrier 38. The carrier 38 has a back plate 40 that is connected to the rod 33. The carrier 38 is further provided with a pair of channel members 41 that extend outwardly therefrom. The channel members may be suitably slotted or otherwise shaped to accommodate circuit modules of different configurations. As shown, the particular circuit module 13 is adapted for disposition within and frictional retention by the channels 41, thus to present the leads 20 of the components 18 in a substantially vertical attitude.

The shaft 33 also serves to support a pair of strike members 42 and 43 that are in the form of rectangular plates disposed in side by side relationship, carried by the rod 33 and disposed normal to each other. Opposite corners of the strikes 42 and 43 are suitably rounded as at 44.

Figures 3, 4, 5:
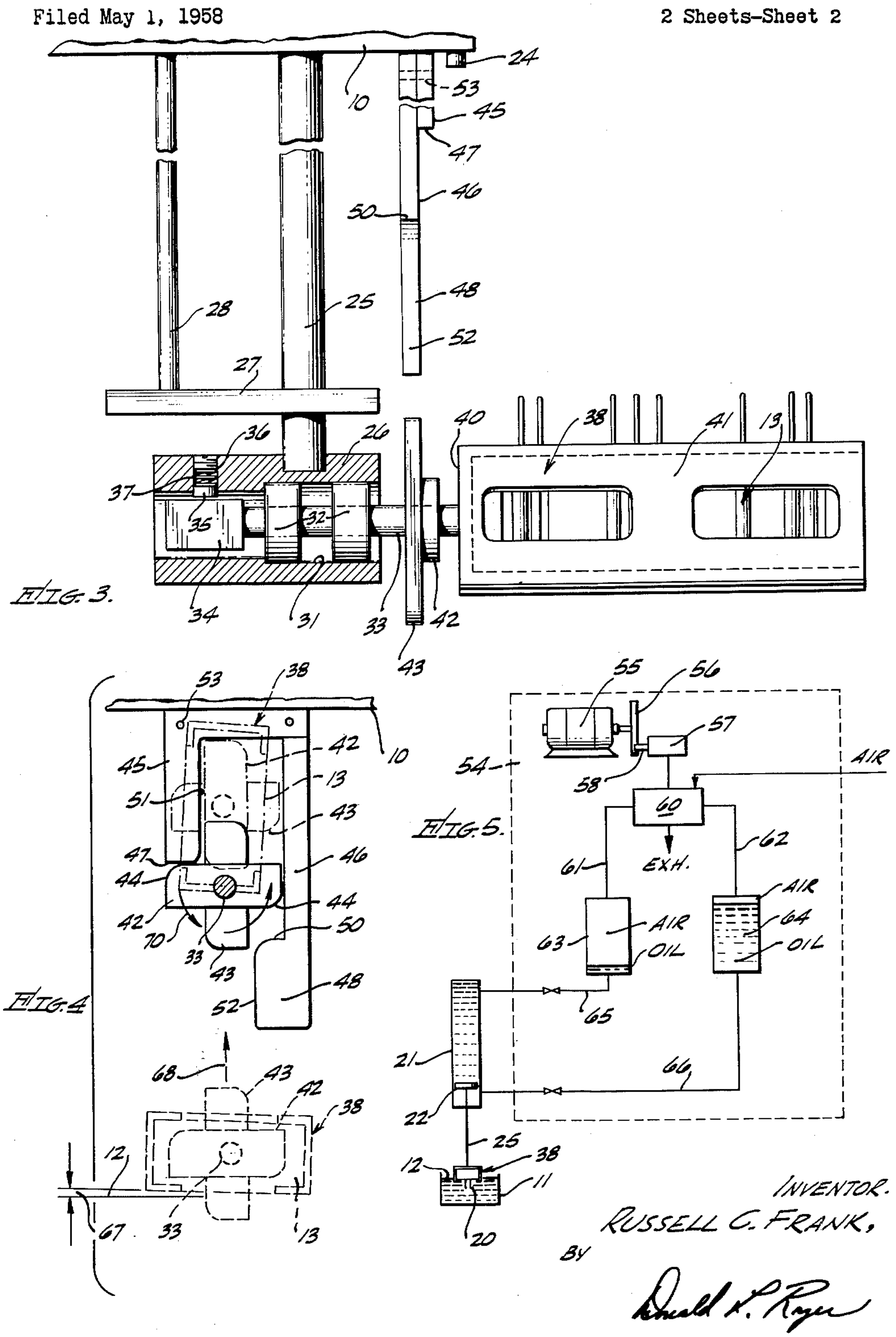
FIG. 3 is an enlarged, fragmentary, partially sectional view of a supporting head for the circuit modules employed herewith.
FIG. 4 is a front elevational view of the support and rotating mechanism forming a portion of the present apparatus and showing apparatus in different positions.
FIG. 5 is a schematic view showing the automatic operating mechanism of the present invention.

As shown in FIGS. 1, 3 and 4, the base 10 serves also to support a pair of elongated cam members 45 and 46 that are disposed downwardly therefrom. The cam member 45 is of a shorter length than the cam member 46 and has a lower end portion 47. The cam member 46 has an enlarged lower end portion 48 and a shoulder 50. The cam members 45 and 46 are disposed in a general parallel relationship, there being a space between an inner edge 51 of the member 45 and an edge 52 of the portion 48 that is in excess of the minor width of the strikes 42 and 43. The cam members 45 and 46 are also disposed in laterally displaced planes and secured to the base 10 by means of screws 53. It is to be noted, with reference to FIG. 3, that the lateral displacement of the members 45 and 46 is commensurate with the lateral displacement of the strikes 42 and 43.

In order to effect automatic operation of the present apparatus, with reference to FIGS. 1 and 5, a control mechanism is provided, this mechanism being contained within a suitable housing 54. The control mechanism within the housing 54 includes a timer motor 55 that is adapted to drive a cam 56 which in turn operates a valve actuator 57 through a suitable follower 58. The valve actuator 57 is adapted to control a valve 60 which in turn serves to direct compressed air from any suitable source (not shown) through conduits 61 or 62 which are in turn connected to liquid reservoirs 63 and 64. The reservoirs 63 and 64 are connected to the cylinder 21 by means of conduits 65 and 66 respectively and upon delivery of compressed air through the conduits 61 through the cylinder 63, liquid in the cylinder 63 will be conducted through the conduit 65 to the cylinder 21, whereby to effect downward movement of the piston 22 and the mechanism carried thereby. Liquid below the piston 22 is displaced through the conduit 66 to the cylinder 64, and air contained in the cylinder 64 is exhausted to atmosphere through the conduit 62 and an exhaust port in the valve 60. A reverse action of the valve 60 will effect an opposite operation whereby to raise the piston 22 and the mechanism carried thereby. The cam 56 may be of any desired contour and may also serve to control operation of a suitable electrical system whereby to permit cycling of the motor 55 through one rotary cycle.

The normal, at rest position of the mechanism is such as to dispose the module carrier 38 at a position intermediate the end portion 48 of the cam member 46 and the surface of the molten solder 12. A circuit module having loosely assembled components therein is disposed in the carrier 38. Upon energization of the motor 55, the piston 22 will be moved downwardly by action of the control contained within the housing 54, whereby to position one surface of the circuit board forming a portion of the module slightly below the level of the molten solder 12. In this connection it is to be noted that the module carrier 38 and the module 13 are slightly angularly disposed as indicated by angle 67, FIG. 4, relative to the upper surface of the molten solder 12, whereby to permit escape of any air that might otherwise be trapped between the surface of the circuit boards 14 and the molten solder. The module is retained with the surface of one of the boards 14 in contact with or slightly below the surface of the molten solder for a predetermined period of time and thereafter is moved out of contact with the solder and upwardly as indicated by the arrow 68, FIG. 4. Upon such upward movement, the strike 42 will engage the lower end portion 47 of the cam member 45, thereby to rotate the shaft 33 and the module carrier 38 through an angle of approximately 90 degrees and in the direction of the arrows 70. Continued upward movement of the piston rod 25 will move the strikes 42 and 43 to the position shown by the dotted lines in the upper portion of FIG. 4. The control mechanism thereafter affects downward movement of the piston 22 and piston rod 25 together with the module carrier 38 and, upon such downward movement, the strike 43, now rotated approximately 90 degrees with respect to its original position, will engage the shoulder 50 of the cam member 46, whereby again to rotate the shaft 33 through another angle of approximately 90 degrees, thus to complete a 180 degree rotation of the shaft 33 and module carrier 38 and dispose the surface of the other of the circuit boards 14 in position for dipping into the molten solder 12. The detent 35, in cooperation with the flattened surfaces of the enlarged member 34, serves positively to position the shaft 33 and carrier 38. Thus, surfaces of both the circuit boards 14 are automatically dipped in the molten solder 12 and the apparatus will come to rest in the position described hereinbefore to permit removal of the soldered module and insertion of another loosely assembled module to be soldered.

Accordingly, it may be seen that complete and accurate soldering of the module is accomplished in an automatic manner and that not only the depth of such soldering is maintained but also an automatic operation is continued, whereby to produce accurate and reliable soldered joints in a rapid and efficient manner.

Having thus described the invention and the present embodiment thereof it is desired to emphasize the fact that many modifications may be resorted to in a manner limited only by a just interpretation of the following claims.

I claim:

1. An apparatus for providing dip soldered connections between component leads and printed circuit boards of cordwood type electronic circuit modules having such boards on opposite sides thereof comprising, in combination: a base structure; a container having a quantity of molten solder therein, said container being disposed at a substantially fixed distance below said base structure; a hydraulic cylinder mounted on said base structure; a piston operably disposed in said cylinder; a piston rod extending from said piston; a circuit module retainer pivotally mounted on an end of said piston rod remote from said piston, said module being adapted for frictional retention in said retainer; a pair of laterally spaced generally parallel cam members depended from said base structure; a pair of normally disposed arms carried by said retainer, each of said arms lying in a plane of one of said cam members, an axis of said retainer and said arms being disposed substantially normal to an axis of said piston rod; and hydraulic control means for selectively delivering hydraulic fluid to opposite sides of said piston in response to a timed cycle, whereby first to move said piston, piston rod and retainer in a downwardly direction, then in an upwardly direction, a repeat downwardly direction and a repeat upwardly direction, said arms being alternately engageable with said cam members whereby to rotate said retainer and said module carried thereby through an angle of 180 degrees upon each of said downward and upward movements of said retainer, each of said movements of said retainer being adapted alternately to dispose surfaces of said module in contact with a surface of said molten solder.

2. An apparatus for providing dip soldered connections between component leads and printed circuit boards of cordwood type electronic circuit modules having such boards on opposite sides thereof comprising, in combination: a base structure; a container having a quantity of molten solder therein, said container being disposed at a substantially fixed distance below said base structure; a hydraulic cylinder mounted on said base structure; a piston operably disposed in said cylinder; a piston rod extending from said piston; a circuit module retainer pivotally mounted on an end of said piston rod remote from said piston, said module being adapted for frictional retention in said retainer; a pair of laterally spaced generally parallel cam members depended from said base structure; a pair of normally disposed arms carried by said retainer, each of said arms lying in a plane of one of said cam members, an axis of said retainer and said arms being disposed substantially normal to an axis of said piston rod; and hydraulic control means for selectively delivering hydraulic fluid to opposite sides of said piston in response to a timed cycle, whereby first to move said piston, piston rod and retainer in a downwardly direction then in an upwardly direction, a repeat downwardly direction and a repeat upwardly direction, said arms being alternately engageable with said cam members whereby to rotate said retainer and said module carried thereby through an angle of 180 degrees upon each of said downward and upward movements of said retainer, each of said movements of said retainer being adapted alternately to dispose surfaces of said module in contact with a surface of said molten solder, said module being supported by said retainer with said surfaces thereof at an angle to said surface of said molten solder.

3. An apparatus for providing dip soldered connections between component leads and printed circuit boards of cordwood type electronic circuit modules having such boards on opposite sides thereof comprising, in combination: a base structure; a container having a quantity of molten solder therein, said container being disposed at a substantially fixed distance below said base structure; a hydraulic cylinder mounted on said base structure, a piston operably disposed in said cylinder; a piston rod extending from said piston; a circuit module retainer pivotally mounted on an end of said piston rod remote from said piston, said module being adapted for frictional retention in said retainer; a guide rod connected to said end of said piston rod and slidably disposed in said base structure, said guide rod serving to prevent rotation of said piston rod; a pair of laterally spaced generally parallel cam members depended from said base structure; a pair of normally disposed arms carried by said retainer, each of said arms lying in a plane of one of said cam members, an axis of said retainer and said arms being disposed substantially normal to an axis of said piston rod; and hydraulic control means for selectively delivering hydraulic fluid to opposite sides of said piston in response to a timed cycle, whereby first to move said piston, piston rod and retainer in a downwardly direction then in an upwardly direction, a repeat downwardly direction and a repeat upwardly direction, said arms being alternately engageable with said cam members whereby to rotate said retainer and said module carried thereby through an angle of 180 degrees upon each of said downward and upward movements of said retainer, each of said movements of said retainer being adapted alternately to dispose surfaces of said module in contact with a surface of said molten solder, said module being supported by said retainer with said surfaces thereof at an angle to said surface of said molten solder.

4. An apparatus for providing dip soldered connections between component leads and printed circuit boards of cordwood type electronic circuit modules having such boards on opposite sides thereof comprising, in combination: a base structure; a container having a quantity of molten solder therein, said container being disposed at a substantially fixed distance below said base structure; a hydraulic cylinder mounted on said base structure; a piston operably disposed in said cylinder; a piston rod extending from said piston; a circuit module retainer pivotally mounted on an end of said piston rod remote from said piston, said module being adapted for frictional retention in said retainer; a guide rod connected to said end of said piston rod and slidably disposed in said base structure, said guide rod serving to prevent rotation of said piston rod; a pair of laterally spaced generally parallel cam members depended from said base structure; a pair of normally disposed arms carried by said retainer, each of said arms lying in a plane of one of said cam members, an axis of said retainer and said arms being disposed substantially normal to an axis of said piston rod; hydraulic control means for selectively delivering hydraulic fluid to opposite sides of said piston in response to a timed cycle whereby first to move said piston, piston rod and retainer in a downwardly direction then in an upwardly direction, a repeat downwardly direction and a repeat upwardly direction, said arms being alternately engageable with said cam members whereby to rotate said retainer and said module carried thereby through an angle of 180 degrees upon each of said downward and upward movements of said retainer; and detent means for retaining said retainer in said rotated positions, each of said movements of said retainer being adapted alternately to dispose surfaces of said module in contact with a surface of said molten solder, said module being supported by said retainer with said surfaces thereof at an angle to said surface of said molten solder.

5. A dipping apparatus, comprising: a reciprocatable dipping member operable between dipping and retracted positions; a rotatable shaft mounted on said reciprocatable dipping member for rotation about an axis disposed transversely of the path of movement of said dipping member; mounting means on said shaft for mounting a member to be dipped; elongated strike members mounted on said shaft in side by side relationship at an angle of substantially ninety degrees to one another and substantially normal to said shaft, each strike member having strike portions extending on opposite sides of said shaft; and respective cams disposed in the plane of rotation of said strike members in positions displaced from one another along the path of movement of said strike members and on opposite sides of said shaft to engage the strike portions of said respective strike members.

References Cited in the file of this patent

UNITED STATES PATENTS

| | | |
|---|---|---|
| 1,997,694 | Morick et al. | Apr. 16, 1935 |
| 2,699,133 | Ames et al. | Jan. 11, 1955 |
| 2,771,047 | Zimmerman | Nov. 20, 1956 |
| 2,875,717 | McWilliams | Mar. 3, 1959 |
| 2,964,007 | Buffington | Dec. 13, 1960 |